United States Patent
Inazuki et al.

(10) Patent No.: US 11,789,357 B2
(45) Date of Patent: Oct. 17, 2023

(54) METHOD OF MANUFACTURING REFLECTIVE MASK BLANK, AND REFLECTIVE MASK BLANK

(71) Applicant: Shin-Etsu Chemical Co., Ltd., Tokyo (JP)

(72) Inventors: Yukio Inazuki, Joetsu (JP); Takuro Kosaka, Joetsu (JP); Tsuneo Terasawa, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 356 days.

(21) Appl. No.: 17/181,026

(22) Filed: Feb. 22, 2021

(65) Prior Publication Data
US 2021/0278759 A1 Sep. 9, 2021

(30) Foreign Application Priority Data
Mar. 3, 2020 (JP) .................................. 2020-035517

(51) Int. Cl.
*G03F 1/24* (2012.01)
*C23C 14/34* (2006.01)
(Continued)

(52) U.S. Cl.
CPC ............ *G03F 1/24* (2013.01); *C23C 14/3464* (2013.01); *G03F 1/58* (2013.01); *H01L 21/0332* (2013.01); *H01L 21/0337* (2013.01)

(58) Field of Classification Search
CPC ......... G03F 1/24; G03F 1/58; C23C 14/0042; C23C 14/352; C23C 14/3485;
(Continued)

(56) References Cited

U.S. PATENT DOCUMENTS 5,158,933 A * 10/1992 Holtz ................... C23C 14/541
204/192.15
5,513,040 A * 4/1996 Yang ....................... G02B 5/20
359/585
(Continued)

FOREIGN PATENT DOCUMENTS

JP 2000-309868 A 11/2000
JP 2002-222764 A 8/2002
(Continued)

OTHER PUBLICATIONS

Extended European Search Report dated Jul. 29, 2021, in European Patent Application No. 21159655.6.
(Continued)

*Primary Examiner* — Jaehwan Oh
(74) *Attorney, Agent, or Firm* — Birch, Stewart, Kolasch & Birch, LLP

(57) ABSTRACT

A reflective mask blank including a substrate, a multilayer reflection film consisting of at least two first layers and at least two second layers that are laminated alternatively and having different optical properties each other, and an absorber film are manufactured by a sputtering method. Each layer is formed by two stages consisting of a first stage applied from when the forming of each layer is started and until a prescribed thickness is formed, and a second stage applied from when the prescribed thickness is formed and until the forming of each layer is completed, and a sputtering pressure of the first stage is set to higher than both a sputtering pressure at which the forming of the layer formed just before is completed, and a sputtering pressure of the second stage.

10 Claims, 3 Drawing Sheets

(51) Int. Cl.
 *G03F 1/58* (2012.01)
 *H01L 21/033* (2006.01)
(58) Field of Classification Search
 CPC .............. C23C 14/3464; C23C 14/185; H01L 21/0332; H01L 21/0337
 See application file for complete search history.

(56) References Cited

U.S. PATENT DOCUMENTS

| | | | |
|---|---|---|---|
| 6,229,652 B1* | 5/2001 | Bajt | G02B 5/26 |
| | | | 359/359 |
| 6,620,298 B1 | 9/2003 | Hayata | |
| 2002/0076625 A1 | 6/2002 | Shoki et al. | |
| 2002/0090534 A1* | 7/2002 | Shirasaki | G01R 33/093 |
| | | | 428/811.3 |
| 2006/0202610 A1* | 9/2006 | Karasawa | H10K 50/865 |
| | | | 313/498 |
| 2007/0077499 A1 | 4/2007 | Ikuta et al. | |
| 2009/0017387 A1 | 1/2009 | Shoki | |
| 2009/0314740 A1 | 12/2009 | Ikemoto et al. | |
| 2010/0080647 A1* | 4/2010 | Terasawa | B82Y 10/00 |
| | | | 430/319 |
| 2012/0225375 A1 | 9/2012 | Mikami | |
| 2013/0105298 A1 | 5/2013 | Tsunekawa et al. | |
| 2015/0064611 A1* | 3/2015 | Shih | G03F 1/24 |
| | | | 430/5 |
| 2015/0107516 A1 | 4/2015 | Tsunekawa et al. | |
| 2015/0262796 A1 | 9/2015 | Ishihara et al. | |
| 2015/0331312 A1 | 11/2015 | Hamamoto et al. | |
| 2016/0155460 A1* | 6/2016 | Srinivasan | G11B 5/7369 |
| | | | 204/192.1 |
| 2018/0083166 A1* | 3/2018 | Takenaka | H01L 33/405 |
| 2022/0299862 A1* | 9/2022 | Akagi | G03F 7/20 |

FOREIGN PATENT DOCUMENTS

| | | |
|---|---|---|
| JP | 2006-91202 A | 4/2006 |
| JP | 2008-103481 A | 5/2008 |
| JP | 2009-510711 A | 3/2009 |
| JP | 2009-302550 A | 12/2009 |
| JP | 2015-155577 A | 8/2015 |
| JP | 2016-166426 A | 9/2016 |
| WO | WO 2013/145050 A1 | 10/2013 |

OTHER PUBLICATIONS

Yu et al., "Low-stress and high-reflectance Mo/Si multilayers for EUVL by magnetron sputtering deposition with bias assistance," Proc. of SPIE (2018), vol. 10583, pp. 105831T-1-105831T-12.

* cited by examiner

METHOD OF MANUFACTURING REFLECTIVE MASK BLANK, AND REFLECTIVE MASK BLANK

CROSS-REFERENCE TO RELATED APPLICATION

This non-provisional application claims priority under 35 U.S.C. § 119(a) on Patent Application No. 2020-35517 filed in Japan on Mar. 3, 2020, the entire contents of which are hereby incorporated by reference.

TECHNICAL FIELD

The present invention relates to a reflective mask blank which is a material for a reflective mask used for manufacturing semiconductor devices such as LSIs, and a method of manufacturing thereof.

BACKGROUND ART

In a manufacturing process of a semiconductor device, a photolithography technique in which a circuit pattern formed on a transfer mask is transferred onto a semiconductor substrate (semiconductor wafer) through a reduction projection optical system with irradiating exposure light to the transfer mask is used. At present, a mainstream wavelength of the exposure light is 193 nm by argon fluoride (ArF) excimer laser light.

However, since it is necessary to form a further fine pattern, EUV lithography technique using, as exposure light, extreme ultraviolet (hereinafter referred to "EUV") light having a wavelength shorter than the ArF excimer laser light is promising. EUV light is light having a wavelength of about 0.2 to 100 nm, more specifically, light having a wavelength of about 13.5 nm. This EUV light has a very low transparency to a substance and cannot be utilized for a conventional transmissive projection optical system or a mask, thus, a reflection type optical elemental device is applied. Therefore, a reflective mask is also proposed as a mask for the pattern transfer. The reflective mask has a multilayer reflection film that is formed on a substrate and reflects EUV light, and a patterned absorber film that is formed on the multilayer reflection film and absorbs EUV light, and such a mask is used as a common reflective mask. A pattern is formed on an object for transferring the pattern such as a silicon wafer by utilizing a difference of reflectance of EUV light as an exposure light, caused by presence and absence of the absorber film on the multilayer reflection film.

A reflective mask is manufactured from a reflective mask blank. The reflective mask blank includes a multilayer reflection film that is formed on a substrate and reflects exposure light, and an absorber film that is formed on thereon and has a low reflectance with respect to the exposure light, and further includes ordinally a protection film between the multilayer reflection film and the absorber film. The multilayer reflection film is formed by laminating alternatively layers having different refraction indexes. For example, a multilayer reflection film in which molybdenum (Mo) layers and silicon (Si) layers are alternatively laminated is used for EUV light exposure.

CITATION LIST

Patent Document 1: JP-A 2009-510711

SUMMARY OF THE INVENTION

It is required that the reflective mask blank has a good flatness for the purposes of improvement of optical properties and easy detection of defects. In exposure using the reflective mask, the exposure light is absorbed by the absorber film, and reflected by the multilayer reflection at the portion of the exposed multilayer reflection film. The reflectance of the multilayer reflection film is preferably higher to obtain high contrast in the exposure. Further, the multilayer reflective film having a high reflectance can be shorten exposure time for which an object for transferring a pattern, specifically, a resist film formed on an object to be transferred a pattern such as a silicon wafer is exposed to a prescribed exposure amount. Thus, the multilayer reflection film is required to have a higher reflectance in order to improve throughput of an exposure process.

The present invention has been made to solve the above problems, and an object of the present invention is to provide a reflective mask blank including a multilayer reflection film that can provide a higher reflectance for exposure light when a reflective mask is used for exposure, and a method of manufacturing thereof.

The inventors have been found that when a multilayer reflection film consisting of at least two first layers and at least two second layers that are laminated alternatively and have different optical properties each other is formed, a multilayer reflection film having a high reflectance with respect to extreme ultraviolet (EUV) light having a wavelength of 13 to 14 nm can be obtained by a sputtering method to form the first and second layers alternatively. In the sputtering method, each layer is formed by two stages consisting of a first stage applied from when the forming of said each layer is started and until a prescribed thickness is formed, and a second stage applied from when the prescribed thickness is formed and until the forming of said each layer is completed. Further, in forming the layer subsequent to forming the last layer, a sputtering pressure of the first stage is set to higher than both a sputtering pressure at which the forming of the layer formed just before is completed, and a sputtering pressure of the second stage.

In one aspect, the invention provides a method of manufacturing a reflective mask blank including a substrate, a multilayer reflection film formed on one main surface of the substrate, and an absorber film formed on the multilayer reflection film, the multilayer reflection film consisting of at least two first layers and at least two second layers that are laminated alternatively, the first and second layers having different optical properties each other, the method including the step of forming the first and second layers constituting the multilayer reflection film alternatively by a sputtering method, wherein in the forming step of the first and second layers constituting the multilayer reflection film, each layer is formed by two stages consisting of a first stage applied from when the forming of said each layer is started and until a prescribed thickness is formed, and a second stage applied from when the prescribed thickness is formed and until the forming of said each layer is completed, and in forming the second layer subsequent to forming the first layer, or in forming the first layer subsequent to forming second layer, a sputtering pressure of the first stage is set to higher than both a sputtering pressure at which the forming of the layer formed just before is completed, and a sputtering pressure of the second stage.

Preferably, the prescribbed thickness formed in the first stage is at least 1/20 and less than 1/2 of the total thickness formed in the whole of the first and second stages.

Preferably, the sputtering pressure of the first stage is at least 0.08 Pa, and a sputtering pressure of the second stage is less than 0.08 Pa.

Preferably, the sputtering method is a magnetron sputtering method.

Preferably, the sputtering pressures of the first and second stages are adjusted by argon gas.

Preferably, the first and second layers are a Si layer and a Mo layer, respectively, and the first and second layers are laminated alternatively at least 40 layers, respectively.

In another aspect, the invention provides a reflective mask blank including a substrate, a multilayer reflection film formed on one main surface of the substrate, and an absorber film formed on the multilayer reflection film, the multilayer reflection film consisting of at least two first layers and at least two second layers that are laminated alternatively, the first and second layers having different optical properties each other.

Preferably, the multilayer reflection film has a reflectance of at least 66.5% with respect to extreme ultraviolet (EUV) light having a wavelength of 13 to 14 nm at an incident angle of 6°.

Preferably, the first and second layers are a Si layer and a Mo layer, respectively, and the first and second layers are laminated alternatively at least 40 layers, respectively.

Preferably, the main surface of the substrate on which the multilayer reflection film is formed has a surface roughness RMS of not more than 0.15 nm.

Advantageous Effects of the Invention

According to the invention, a reflective mask blank including a multilayer reflection film having a higher reflectance with respect to exposure light when a reflective mask is used for exposure can be provides by manufacturing with high productivity.

DESCRIPTION OF THE PREFERRED EMBODIMENT

In the specification, a chemical formula of a compound indicates constituent elements and does not indicate a composition ratio.

A reflective mask blank of the invention includes a substrate, a multilayer reflection film formed on one main surface (front side surface) of the substrate, specifically, a multilayer reflection film for reflection of exposure light such as extreme ultraviolet (EUV) light, and an absorber film formed on the multilayer reflection film, specifically, an absorber film for absorption of exposure light such as EUV light and reduction of reflectance. A reflective mask such as an EUV reflective mask including an absorber pattern (a patter of the absorber film) formed by patterning the absorber film is manufactured from the reflective mask blank such as an EUV reflective mask blank. The EUV light for EUV lithography has a wavelength of 13 to 14 nm, typically about 13.5 nm.

The multilayer reflection film is preferably disposed contiguously on one main surface of the substrate. However, an underlayer film may be provided between the substrate and the multilayer reflection film as long as effects of the invention are not impaired. The absorber film may be disposed contiguously on the multilayer reflection film. However, a protection film (for the multilayer reflection film) may be provided between the multilayer reflection film and the absorber film. The protection film is disposed preferably in contact with the multilayer reflection film, more preferably in contact with both of the multilayer reflection film and the absorber film. The protection film is used to protect the multilayer reflection film in processing step such as cleaning and correction. Further, the protection film preferably has a function of protecting the multilayer reflection film when the absorber film is patterned by etching or a function of preventing oxidation of the multilayer reflection film. On the other hand, a conductive film may be formed on another main surface (back side surface) of the substrate which is the opposite side to the one main surface, preferably in contact with the substrate. The conductive film is used for holding a reflective mask on an exposure tool by an electrostatic chuck. In the above description, one main surface of the substrate is defined as the front side or the upper side, and another main surface is defined as the back side or the lower side. However, the front and back sides or the upper and lower sides in both surfaces are defined for the sake of convenience. Two main surfaces (film forming surfaces) are one and another main surfaces, respectively. The front and back sides or the upper and lower sides may be substituted.

Figure 1:
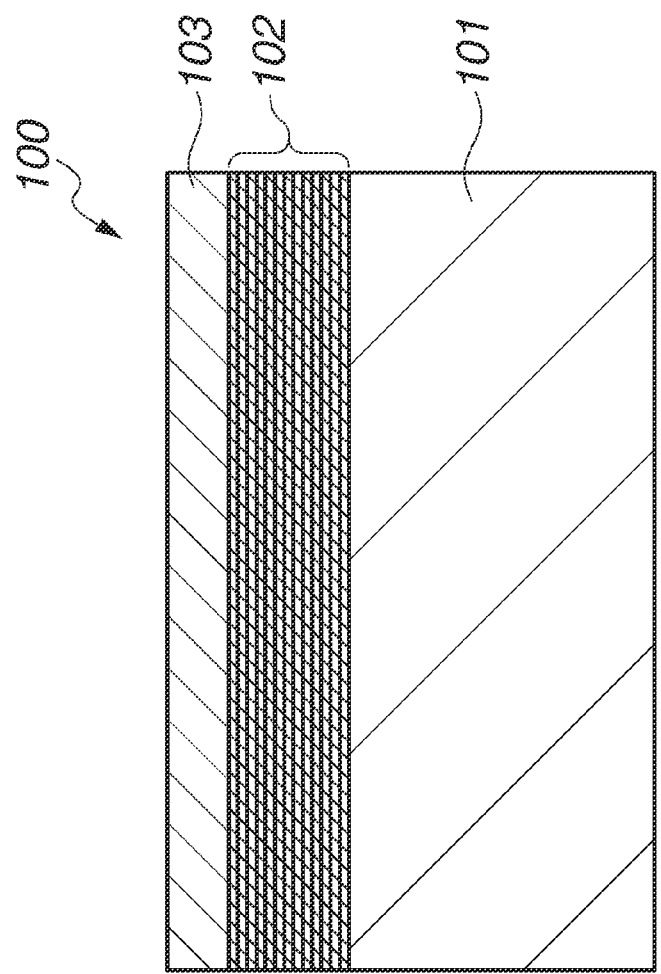
FIG. 1 is a cross-sectional view illustrating an example of a reflective mask blank.
Figure 2:
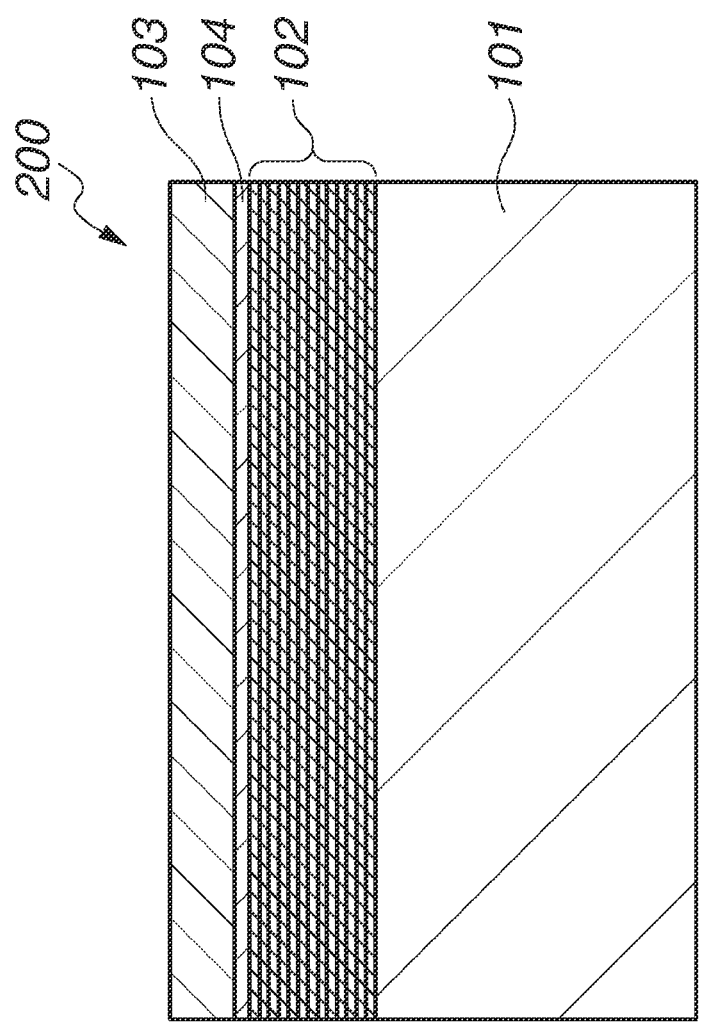
FIG. 2 is a cross-sectional view illustrating another example of a reflective mask blank.
Figure 3:
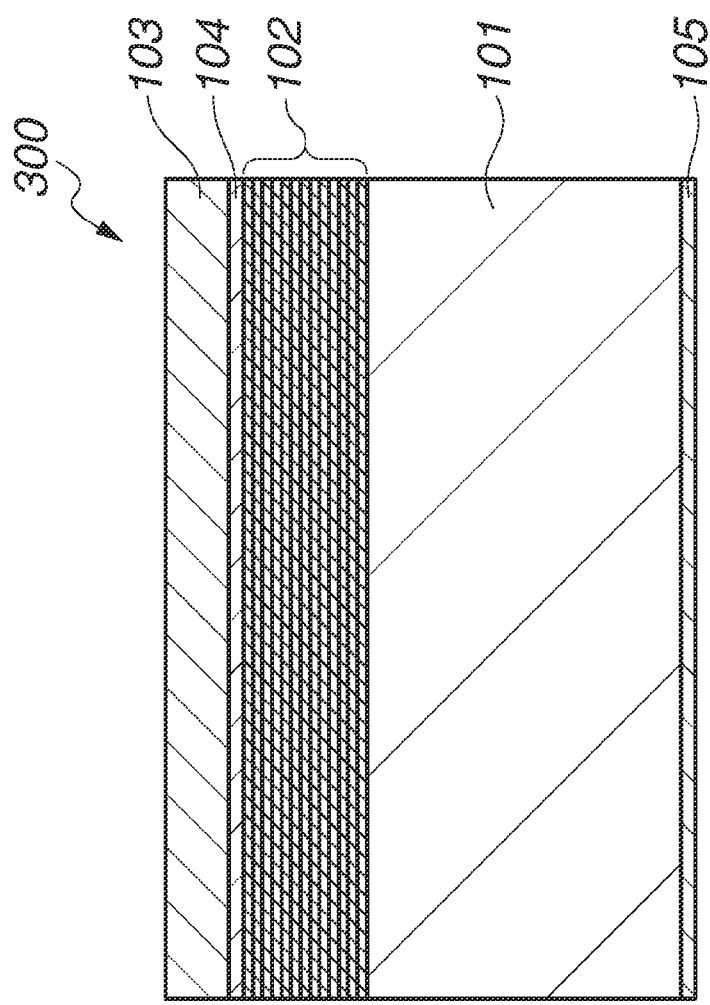
FIG. 3 is a cross-sectional view illustrating the other example of a reflective mask blank.

Typical examples of reflective mask blanks of the invention are shown in FIGS. 1 to 3. FIG. 1 is a cross-sectional view illustrating an example of a reflective mask blank. The reflective mask blank 100 includes a multilayer reflection film 102 disposed contiguously on one main surface of a substrate 101, and an absorber film 103 disposed contiguously on the multilayer reflection film 102. FIG. 2 is a cross-sectional view illustrating another example of a reflective mask blank. The reflective mask blank 200 includes a multilayer reflection film 102 disposed contiguously on one main surface of a substrate 101, a protection film 104 disposed contiguously on the multilayer reflection film 102, and an absorber film 103 disposed contiguously on the protection film 104. FIG. 3 a cross-sectional view illustrating the other example of a reflective mask blank. The reflective mask blank 300 includes a multilayer reflection film 102 disposed contiguously on one main surface of a substrate 101, a protection film 104 disposed contiguously on the multilayer reflection film 102, an absorber film 103 disposed contiguously on the protection film 104, and a conductive film 105 disposed contiguously on another main surface of a substrate 101.

For example, a 6025 substrate which has a size of 6 inch-6 inch×0.25 inch-thick may be used as the substrate of the invention. In a case where the SI unit system is used, the 6025 substrate is generally represented as a substrate having a size of 152 mm×152 mm×6.35 mm-thick. The substrate is to be reduced distortion of the pattern due to thermal expansion during exposure, thus, coefficient of thermal expansion of the substrate is preferably not more than 30 ppb/° C., more preferably not more than 10 ppb/° C., as an absolute value. Examples of a material for the substrate include titania-doped quartz glass ($SiO_2$—$TiO_2$-based glass) and other materials.

A flat substrate is preferable in viewpoint to obtaining high position accuracy in detecting defects in the multilayer reflection film, forming an absorber pattern, or detecting defects in the absorber film. On the main surface which is the side of forming the multilayer reflection film, a flatness is preferably not more than 0.1 μm, more preferably not more than 0.05 μm, in an exposure pattern forming area. The exposure pattern forming area is, for example, in case of a 6025 substrate, the central area of the main surface, for example, the range of 132 mm×132 mm. In order to obtain high reflectance on the main surface which is the side of forming the multilayer reflection film, the surface roughness is preferably smaller. Thus, the surface roughness RMS (root mean square roughness) is preferably not more than 0.15 nm, more preferably not more than 0.1 nm. In the invention, the surface roughness RMS may be a value measured, for example, in the range of 1 μm-square by an atomic force microscope AFM.

On the other hand, another main surface which is the opposite side to the one main surface on which a multilayer reflection film is formed is usually a surface that is adsorbed when the reflective mask is set on an exposure tool. Thus, another main surface of the substrate is also preferably flat, and the flatness is preferably not more than 1 μm so that sufficient pattern position accuracy can be obtained.

In the reflective mask, the multilayer reflection film is a film for reflecting exposure light such as EUV light. As the multilayer reflection film, an alternatively laminated layers consisting of a plurality of kinds of layers having different optical properties, for example, a first layer and a second layer laminated alternatively and having different optical properties each other is used. Particularly, a plurality of kinds of layers having different refractive indexes, for example, a high refractive index and a low refractive index are laminated periodically. For EUV light, silicon (Si) is used as a material having a high refraction index, molybdenum (Mo) is uses as a material having a low refraction index, and an Si/Mo laminated film in which silicon (Si) layers and molybdenum (Mo) layers are alternatively laminated is exemplified as the multilayer reflection film. The plurality of kinds of layers are laminated, for example, at least 2 cycles (at least 2 layers, respectively), preferably at least 40 cycles (at least 40 layers, respectively), and not more than 60 cycles (not more than 60 layers, respectively). When the cycles are too few, reflectance may be low, and when the cycles are too many, the film may become thick and have large film stress. In case of the Si/Mo laminated film, the silicon (Si) layer and the molybdenum (Mo) layer preferably consist of, respectively, silicon only and molybdenum only. However, the silicon layer and the molybdenum layer may be composed of a silicon compound and molybdenum compound, respectively.

In case of the Si/Mo laminated film, the layer closet to the substrate may be either the Si layer or the Mo layer. The layer remotest from the substrate may be either the Si layer or the Mo layer, however, the remotest layer is preferably the Si layer. The thicknesses of a high refraction index layer and a low refraction index layer in the multilayer reflection film is set to suitable thicknesses in accordance with an exposure wavelength. For example, in case of EUV light (an exposure wavelength of 13 to 14 nm), a thickness of the high refraction index layer and the low refraction index layer per one cycle is preferably adjusted to 6 to 8 nm, and a thickness of the high refraction index layer is preferably adjusted to 10 to 90% of the total thickness of the one cycle. In addition, each thickness of the high refraction index layer and the low refraction index layer may be constant or individually different. A thickness of the whole of the multilayer reflection film is normally about 240 to 320 nm.

As a method for forming a multilayer reflection film, a sputtering method in which power is supplied to a target and an ambient gas is turned into plasma (ionization) by the supplied power to perform sputtering, and an ion beam sputtering method in which an ion beam is irradiated to a target are exemplified. As a sputtering method, a DC sputtering method in which a DC voltage is applied to a target, and an RF sputtering method in which a high frequency voltage is applied to a target. The ion beam sputtering method is generally used for forming the multilayer reflection film since the surface roughness can be reduced. However, in the ion beam sputtering method, a film forming apparatus is expensive, and productivity is low.

In the invention, the multilayer reflection film is formed by a sputtering method. The sputtering method is a film forming method that utilizes sputtering phenomenon of gas ions by applying a voltage to a target with feeding a gas such as Ar gas into a chamber to ionize the gas. Particularly, a magnetron sputtering method has an advantage in productivity. The magnetron sputtering method is a sputtering method in which a magnet is placed to the back side of a target thereby a plasma density of the target is increased at the vicinity above the target by a magnetic field. The magnetron sputtering is preferably applied for the film forming since plasma is maintained even if a gas pressure (sputtering pressure) at the time of discharge is low, and a sputtering rate is high. The power may be applied to the target by a DC system or an RF system. The DC system also includes a pulse sputtering that inverts a negative bias applied to the target for a short time in order to prevent charge-up of the target.

The forming of the multilayer reflection film by the sputtering method can be performed, for example, by using a sputtering equipment capable of attaching a plurality of targets. Specifically, the multilayer reflection film may be formed by using a metal or metalloid target (for example, Si target) constituting the first layer, a metal or metalloid target (for example, Mo target) constituting the second layer, and a rare gas such as Ar gas and Kr gas, as a sputtering gas, facing the target and the main surface of the substrate each other, and then sputtering the metal or metalloid target constituting the first layer and the metal or metalloid target constituting the second layer alternatively to form the first layer and the second layer alternatively. Sputtering is preferably carried out while rotating the substrate along the main surface.

In case of the Si/Mo laminated film, when the silicon (Si) layer and the molybdenum (Mo) layer are composed of a silicon compound and a molybdenum compound, respectively, the film can be formed by a reactive sputtering in which a reactive gas such as an oxygen-containing gas, a nitrogen-containing gas, a carbon-containing gas, and other gases is used, as a sputtering gas, along with a rare gas. Further, the target may be composed of a silicon compound or a molybdenum compound.

With respect to a sputtering gas pressure in the forming of the multilayer reflection film by sputtering method, reflectance can be improved by setting a sputtering pressure to high at an initial term of forming of each layer, and then setting the puttering pressure to low. In other words, in the forming of the multilayer reflection film, the forming of the layer (the first layer and/or the second layer) preferably consists of a first stage applied from when the forming of said each layer is started and until a prescribed thickness is formed, and a second stage applied from when the prescribed thickness is formed and until the forming of said each layer is completed. In this case, in forming the second layer subsequent to forming the first layer, or in forming the first layer subsequent to forming second layer, a sputtering pressure of the first stage may be effectively set to higher than both a sputtering pressure at which the forming of the layer formed just before is completed, and a sputtering pressure of the second stage.

The switching of the sputtering between the sputtering by the metal or metalloid target constituting the first layer and the sputtering by the metal or metalloid target constituting the second layer may be conducted at the same time of both the end of sputtering by one target (end of power supplying) and the start of sputtering by the other target (start of power supplying). The switching may be conducted at the time of the end of sputtering by one target (end of power supplying) followed by the start of sputtering by the other target (start of power supplying) that is delayed for a prescribed time, for example, 1 to 30 seconds from the end.

A thickness (the prescribed thickness) formed in the first stage is preferably at least 1/20, more preferably at least 1/10, and preferably less than 1/2, more preferably not more than 1/4, of the total thickness formed in the whole of the first and second stages. A sputtering pressure of the first stage is preferably at least 0.08 Pa, and a sputtering pressure of the second stage is preferably less than 0.08 Pa. That is to say, a border of the sputtering pressure may be set to 0.08 Pa, and the sputtering pressure may consist of a pressure for the first stage in which a part of the layer is formed at a sputtering pressure in the range of the border or higher than the border, and a sputtering pressure for the second stage in which the remainder of the layer is formed at a sputtering pressure in the range of lower than the border. The sputtering pressures of the first and second stages may be adjusted by a rare gas such as Ar gas and Kr gas. From the second stage for forming the last layer to the first stage for forming the next layer, further from the first stage to the second stage for forming the layer, the sputtering pressure is preferably adjusted by increasing or decreasing an amount (flow rate) of a rare gas such as Ar gas and Kr gas to change the sputtering pressure.

A high reflectance can be obtained by forming the multilayer reflection film in such a way. Further, a surface roughness can be controlled to low by forming the multilayer reflection film in such a way. For example, a surface roughness RMS of main surface of the multilayer reflection film may be controlled to not more than 0.2 nm, particularly not more than 0.15 nm.

In the invention, a multilayer reflection film having a high reflectance can be obtained by forming a multilayer reflection film by the method described above. Although it depends on the composition and layer configuration of the multilayer reflection film, for example, a multilayer reflection film having a reflectance with respect to extreme ultraviolet (EUV) light at an incident angle of 6° of preferably at least 65%, more preferably at least 66%, most preferably at least 66.5% can be obtained. This reflectance is the highest value (peak value) in an exposure pattern forming area (area where the absorber pattern is formed) of the multilayer reflection film. On the other hand, a minimum value of the reflectance in the exposure pattern forming area of the multilayer reflection film is preferably at least 60%, more preferably at least 62%. Further, an average value of the reflectance in the exposure pattern forming area is preferably at least 62%, more preferably at least 64%.

The absorber film formed on the multilayer film is a film that absorbs exposure light and reduces reflectance of the exposure light. A transfer pattern in a reflective mask is formed by a difference of reflectance between a portion on which the absorber film is formed and a portion on which the absorber film is not formed. The absorber film may have phase shift function. When the absorber film does not assume phase shift function, a reflectance of the absorber film is preferably not more than 10%, more preferably not more than 5%, most preferably not more than 2% with respect to exposure light, particularly EUV light. On the other hand, when the absorber film has phase shift function, the absorber film may have a reflectance with respect to exposure light higher than the reflectance of the absorber film that does not assume phase shift function. In this case, a reflectance of the absorber film is preferably not more than 50%, more preferably not more than 30% with respect to exposure light, particularly EUV light, and as same in the case of the absorber film that does not assume phase shift function, the reflectance of the absorber film is preferably not more than 10%, more preferably not more than 5%, most preferably not more than 2%. A phase shift amount (difference of phase) of the absorber film having phase shift function is a difference of phase between a reflected light from a portion on which the absorber film is formed and a reflected light from a portion on which the absorber film is not formed. The phase shift amount is preferably at least 150°, more preferably at least 170°, and preferably not more than 210°, more preferably not more than 190°, and most preferably about 180°. Resolution can be increased by using phase shift effect.

The absorber film may be a single layer or a multilayer. In case of multilayer, the multilayer may be configured by an absorber layer, and an antireflection layer that is disposed the side remote from the substrate in the absorber film, and has antireflection function to inspection light using in inspecting of the absorber film. The inspection sensitivity of pattern inspection can be increased by this configuration. Further, a layer for enhancing irradiation resistibility to exposure light may be formed as an outermost surface layer disposed the side remote from the substrate in the absorber film. In case of an absorber film having phase shift function, when the film is a single layer, it is difficult to adjust reflectance since the reflectance of the absorber film depends to a material of the absorber film. When the absorber film is a multilayer configured by a layer mainly assuming phase shift function, and a layer mainly assuming antireflection function that is disposed the side remote from the substrate in the absorber film, and has antireflection function to inspection light using in inspecting of the absorber film, it is possible to set the phase shift and the reflectance of the absorber film having phase shift function with high flexibility.

A material of the absorber film is not particularly limited as long as the material can absorb exposure light such as EUV light and can be processed to an absorber pattern. Examples of the material of the absorber film include, for example, a material containing chromium (Cr) or tantalum (Ta). The material containing chromium (Cr) or tantalum (Ta) may contain oxygen (O), nitrogen (N), carbon (C), boron (B), and other elements. Particularly, examples of the material containing chromium include, for example, Cr (simple substance), and a chromium compound such as CrO, CrN, CrON, CrC, CrCN, CrCO, CrCON, CrB, CrOB, CrNB, CrONB, CrCB, CrCNB, CrCOB and CrCONB.

Examples of the material containing tantalum include, for example, Ta (simple substance), and a tantalum compound such as TaO, TaN, TaON, TaC, TaCN, TaCO, TaCON, TaB, TaOB, TaNB, TaONB, TaCB, TaCNB, TaCOB and TaCONB.

In case that the absorber film is a multilayer configurated by an absorber layer and an antireflection layer, or a multilayer configurated by a layer mainly assuming phase shift function, and a layer mainly assuming antireflection function, metal elements such as chromium (Cr) and tantalum (Ta) may be varied in each of the layers. However, oxygen (O), nitrogen (N), carbon (C) and/or boron (B) may be varied in each of the layers with the common metal element to modify the function of each layer. A thickness of the absorber film is normally about 30 to 100 nm.

The absorber film can be formed by a sputtering method, and the sputtering method is preferably a magnetron sputtering method. Specifically, the absorber film may be formed by a sputtering method using a metal target such as a chromium target and a tantalum target, and/or a metal compound target such as a chromium compound target and a tantalum compound target (a target containing a metal such as chromium and tantalum, and oxygen (O), nitrogen (N), carbon (C) and/or boron (B)), and a rare gas such as Ar gas and Kr gas, as a sputtering gas. Further, the absorber film may also be formed by a reactive sputtering in which a reactive gas such as an oxygen-containing gas, a nitrogen-containing gas, a carbon-containing gas, and other gases is used, along with a rare gas.

A hard mask film which has different etching property from the absorber film and functions as an etching mask in etching when the absorber film is patterned may be provided on the absorber film. After the absorber pattern is formed, the hard mask film may be left as a part of the absorber film or removed to be absent on the reflective mask. Further, the reflective mask blank may include a resist film such as a photoresist film used for patterning the absorber film and other films formed on the side remotest from the substrate. The photoresist film is preferably an electron beam (EB) resist.

Examples of the material of the protection film include a material containing ruthenium (Ru). Particularly, examples of the material containing ruthenium (Ru) include ruthenium (Ru) (simple substance), and a ruthenium alloy containing ruthenium (Ru), and a metal such as titanium (Ti), niobium (Nb), molybdenum (Mo) and zirconium (Zr). The ruthenium alloy preferably contains at least 50% and less than 100% of ruthenium. A thickness of the protection film is preferably at least 1 nm, and preferably not more than 10 nm, more preferably not more than 5 nm. The protection film can be formed by, for example, a magnetron sputtering method.

A material and a film thickness of the conductive film are not particularly limited as long as a sheet resistance is not more than $100\Omega/\square$. Examples of the material of the conductive film include, for example, a material containing chromium (Cr) or tantalum (Ta). The material containing chromium (Cr) or tantalum (Ta) may contain oxygen (O), nitrogen (N), carbon (C), boron (B), and other elements. Particularly, examples of the material containing chromium include, for example, Cr (simple substance), and a chromium compound such as CrO, CrN, CrON, CrC, CrCN, CrCO, CrCON, CrB, CrOB, CrNB, CrONB, CrCB, CrCNB, CrCOB and CrCONB. Examples of the material containing tantalum include, for example, Ta (simple substance), and a tantalum compound such as TaO, TaN, TaON, TaC, TaCN, TaCO, TaCON, TaB, TaOB, TaNB, TaONB, TaCB, TaCNB, TaCOB and TaCONB. The thickness of the conductive film is not particularly limited as long as the conductive film functions for an electrostatic chuck use. The thickness is normally about 5 to 50 nm. The thickness of the conductive film is preferably formed so that a film stress is balanced with the multilayer reflection film and the absorber pattern after a reflective mask is obtained, that is, after the absorber pattern is formed. The conductive film can be formed by, for example, a magnetron sputtering method.

EXAMPLES

Examples of the invention are given below by way of illustration and not by way of limitation.

Experimental Example 1

A multilayer reflection film was formed on a quartz glass substrate having sizes of 152 mm square and 6.35 mm thick by a DC magnetron sputtering with using a Mo target and a Si target while the substrate was rotated in facing both target and the main surface of the substrate.

The targets were attached, respectively, to a sputtering equipment capable of attaching two targets and discharging of targets individually or simultaneously. First, a silicon (Si) layer having a thickness of 4 nm was formed by adjusting an inner pressure of a chamber to 0.15 Pa while feeding Ar gas into the chamber, applying power into Si target, at the same time of the start of the power supplying, reducing the flow rate of Ar gas so as to decrease the inner pressure to 0.033 Pa when the forming of the layer is finished (i.e., the power supplying to the Si target is shut off), and applying 1,800 W of power into Si target for 28 seconds. Then, the power supplying to the Si target was shut off.

In the forming of the silicon (Si) layer, the time of the first stage, i.e., the time from the sputter pressure of 0.15 Pa at the start of power supplying of the Si target to the reduced sputter pressure of 0.08 Pa was 2 second. On the other hand, the time of the second stage, i.e., the time from the sputter pressure of less than 0.08 Pa to the sputter pressure of 0.033 Pa at the end of power supplying of the Si target was 26 seconds. Accordingly, a thickness of $\frac{1}{13}$ of the whole of the silicon (Si) layer was formed in the first stage.

Next, a molybdenum (Mo) layer having a thickness of 3 nm was formed by adjusting an inner pressure of a chamber to 0.15 Pa while feeding Ar gas into the chamber, applying power into Mo target, at the same time of the start of the power supplying, reducing the flow rate of Ar gas so as to decrease the inner pressure to 0.036 Pa when the forming of the layer is finished (i.e., the power supplying to the Mo target is shut off), and applying 900 W of power into Mo target for 30 seconds. Then, the power supplying to the Mo target was shut off.

In the forming of the molybdenum (Mo) layer, the time of the first stage, i.e., the time from the sputter pressure of 0.15 Pa at the start of power supplying of the Si target to the reduced sputter pressure of 0.08 Pa was 2 second. On the other hand, the time of the second stage, i.e., the time from the sputter pressure of less than 0.08 Pa to the sputter pressure of 0.036 Pa at the end of power supplying of the Mo target was 28 seconds. Accordingly, a thickness of $\frac{1}{14}$ of the whole of the molybdenum (Mo) layer was formed in the first stage.

The above procedure for forming both layers corresponds to one cycle. The cycles were repeated for 40 cycles, and after forming of the molybdenum (Mo) layer of the $40^{th}$ cycle, the silicon (Si) layer was further formed by the above method, then forming of the multilayer reflection film was completed. The multilayer reflection film includes forty silicon (Si) layers and forty molybdenum layers laminated in this order from the substrate side, and further includes one silicon (Si) layer laminated at the side remotest from the substrate. The multilayer reflection film has a thickness of about 284 nm.

Next, a reflectance of the obtained multilayer reflection film with respect to extreme ultraviolet (EUV) light having a wavelength of 13 to 14 nm at an incident angle of 6° was measured by Automatic Reflectometer for EUV Masks, LPR-1016, manufactured by euv tech. The reflectance was 66.69%.

Experimental Example 2

A multilayer reflection film was formed on a quartz glass substrate having sizes of 152 mm square and 6.35 mm thick by a DC magnetron sputtering with using a Mo target and a Si target while the substrate was rotated in facing both target and the main surface of the substrate.

The targets were attached, respectively, to a sputtering equipment capable of attaching two targets and discharging of targets individually or simultaneously. First, a silicon (Si) layer having a thickness of 4 nm was formed by adjusting an inner pressure of a chamber to 0.10 Pa while feeding Ar gas into the chamber, applying power into Si target, after 2 seconds were passed from the start of the power supplying, reducing the flow rate of Ar gas so as to decrease the inner pressure to 0.033 Pa when the forming of the layer is finished (i.e., the power supplying to the Si target is shut off), and applying 1,800 W of power into Si target for 22 seconds. Then, the power supplying to the Si target was shut off.

In the forming of the silicon (Si) layer, the time of the first stage, i.e., the time for forming at a sputter pressure of 0.10 Pa was 2 seconds, and the time from the sputter pressure of 0.10 Pa to the reduced sputter pressure of 0.08 Pa was 2 second. On the other hand, the time of the second stage. i.e., the time from the sputter pressure of less than 0.08 Pa to the sputter pressure of 0.033 Pa at the end of power supplying of the Si target was 22 seconds. Accordingly, a thickness of ⅙ of the whole of the silicon (Si) layer was formed in the first stage.

Next, a molybdenum (Mo) layer having a thickness of 3 nm was formed by adjusting an inner pressure of a chamber to 0.10 Pa while feeding Ar gas into the chamber, applying power into Mo target, after 2 seconds were passed from the start of the power supplying, reducing the flow rate of Ar gas so as to decrease the inner pressure to 0.036 Pa when the forming of the layer is finished (i.e., the power supplying to the Mo target is shut off), and applying 900 W of power into Mo target for 22 seconds. Then, the power supplying to the Mo target was shut off.

In the forming of the molybdenum (Mo) layer, the time of the first stage, i.e., the time for forming at a sputter pressure of 0.10 Pa was 2 seconds, and the time from the sputter pressure of 0.10 Pa to the reduced sputter pressure of 0.08 Pa was 2 second. On the other hand, the time of the second stage, i.e., the time from the sputter pressure of less than 0.08 Pa to the sputter pressure of 0.036 Pa at the end of power supplying of the Mo target was 22 seconds. Accordingly, a thickness of ⅙ of the whole of the molybdenum (Mo) layer was formed in the first stage.

The above procedure for forming both layers corresponds to one cycle. The cycles were repeated for 40 cycles, and after forming of the molybdenum (Mo) layer of the $40^{th}$ cycle, the silicon (Si) layer was further formed by the above method, then forming of the multilayer reflection film was completed. The multilayer reflection film includes forty silicon (Si) layers and forty molybdenum layers laminated in this order from the substrate side, and further includes one silicon (Si) layer laminated at the side remotest from the substrate. The multilayer reflection film has a thickness of about 284 nm.

Next, a reflectance of the obtained multilayer reflection film with respect to extreme ultraviolet (EUV) light having a wavelength of 13 to 14 nm at an incident angle of 6° was measured by Automatic Reflectometer for EUV Masks, LPR-1016, manufactured by euv tech. The reflectance was 66.53%.

Comparative Experimental Example 1

A multilayer reflection film was formed on a quartz glass substrate having sizes of 152 mm square and 6.35 mm thick by a DC magnetron sputtering with using a Mo target and a Si target while the substrate was rotated in facing both target and the main surface of the substrate.

The targets were attached, respectively, to a sputtering equipment capable of attaching two targets and discharging of targets individually or simultaneously. First, a silicon (Si) layer having a thickness of 4 nm was formed by adjusting and maintaining an inner pressure of a chamber to 0.10 Pa while feeding Ar gas into the chamber, applying 1,800 W of power into Si target for 24 seconds. Then, the power supplying to the Si target was shut off.

Next, a molybdenum (Mo) layer having a thickness of 3 nm was formed by adjusting and maintaining an inner pressure of a chamber to 0.10 Pa while feeding Ar gas into the chamber, applying 900 W of power into Mo target for 24 seconds. Then, the power supplying to the Mo target was shut off.

The above procedure for forming both layers corresponds to one cycle. The cycles were repeated for 40 cycles, and after forming of the molybdenum (Mo) layer of the $40^{th}$ cycle, the silicon (Si) layer was further formed by the above method, then forming of the multilayer reflection film was completed. The multilayer reflection film includes forty silicon (Si) layers and forty molybdenum layers laminated in this order from the substrate side, and further includes one silicon (Si) layer laminated at the side remotest from the substrate. The multilayer reflection film has a thickness of about 284 nm.

Next, a reflectance of the obtained multilayer reflection film with respect to extreme ultraviolet (EUV) light having a wavelength of 13 to 14 nm at an incident angle of 6° was measured by Automatic Reflectometer for EUV Masks, LPR-1016, manufactured by euv tech. The reflectance was 66.25%.

Japanese Patent Application No. 2020-35517 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method of manufacturing a reflective mask blank comprising a substrate, a multilayer reflection film formed on one main surface of the substrate, and an absorber film formed on the multilayer reflection film, the multilayer reflection film consisting of at least two first layers and at least two second layers that are laminated alternatively, the first and second layers having different optical properties each other, the method comprising the step of forming the first and second layers constituting the multilayer reflection film alternatively by a sputtering method, wherein in the forming step of the first and second layers constituting the multilayer reflection film, each layer is formed by two stages consisting of a first stage applied from when the forming of said each layer is started and until a prescribed thickness is formed, and a second stage applied from when the prescribed thickness is formed and until the forming of said each layer is completed, and in forming the second layer subsequent to forming the first layer, or in forming the first layer subsequent to forming second layer, a sputtering pressure of the first stage is set to higher than both a sputtering pressure at which the forming of the layer formed just before is completed, and a sputtering pressure of the second stage.

2. The method of claim 1 wherein the prescribed thickness formed in the first stage is at least 1/20 and less than 1/2 of the total thickness formed in the whole of the first and second stages.

3. The method of claim 1 wherein the sputtering pressure of the first stage is at least 0.08 Pa, and a sputtering pressure of the second stage is less than 0.08 Pa.

4. The method of claim 1 wherein the sputtering method is a magnetron sputtering method.

5. The method of claim 1 wherein the sputtering pressures of the first and second stages are adjusted by argon gas.

6. The method of claim 1 wherein the first and second layers are a Si layer and a Mo layer, respectively, and the first and second layers are laminated alternatively at least 40 layers, respectively.

7. A reflective mask blank manufactured by the method of claim 1, comprising the substrate, the multilayer reflection film formed on one main surface of the substrate, and the absorber film formed on the multilayer reflection film.

8. The reflective mask blank of claim 7 wherein the multilayer reflection film has a reflectance of at least 66.5% with respect to extreme ultraviolet (EUV) light having a wavelength of 13 to 14 nm at an incident angle of 6°.

9. The reflective mask blank of claim 7 wherein the first and second layers are a Si layer and a Mo layer, respectively, and the first and second layers are laminated alternatively at least 40 layers, respectively.

10. The reflective mask blank of claim 7 wherein the main surface of the substrate on which the multilayer reflection film is formed has a surface roughness RMS of not more than 0.15 nm.

* * * * *